United States Patent
Crotzer et al.

[11] Patent Number: 5,977,489
[45] Date of Patent: Nov. 2, 1999

[54] CONDUCTIVE ELASTOMER FOR GRAFTING TO A METAL SUBSTRATE

[75] Inventors: David R. Crotzer, Nashua, N.H.; Mark G. Hanrahan, Little Common, Mass.; Neill N. Silva, Greenville, R.I.

[73] Assignee: Thomas & Betts International, Inc., Sparks, Nev.

[21] Appl. No.: 08/931,142

[22] Filed: Sep. 16, 1997

Related U.S. Application Data

[63] Continuation-in-part of application No. 08/736,830, Oct. 28, 1996.

[51] Int. Cl.⁶ ........................................... H05K 1/09
[52] U.S. Cl. ........................ 174/257; 174/261; 361/767; 439/86; 428/142
[58] Field of Search ...................... 174/257, 261; 361/767, 768, 769, 770, 771; 439/86, 91; 428/344, 328, 142, 901, 323, 209; 257/642, 643, 792

[56] References Cited

U.S. PATENT DOCUMENTS

| | | | |
|---|---|---|---|
| 3,475,213 | 10/1969 | Stow | 428/328 |
| 3,497,383 | 2/1970 | Olyphant, Jr. et al. | 428/162 |
| 3,762,946 | 10/1973 | Stow et al. | 428/551 |
| 3,818,279 | 6/1974 | Seeger, Jr. et al. | 361/751 |
| 5,306,558 | 4/1994 | Takahashi et al. | 428/331 |
| 5,321,583 | 6/1994 | McMahon | 361/770 |
| 5,468,918 | 11/1995 | Kanno et al. | 174/256 |

FOREIGN PATENT DOCUMENTS

2130188  5/1990  Japan .................................... 428/328

*Primary Examiner*—Dean A. Reichard
*Assistant Examiner*—Dhiru R Patel
*Attorney, Agent, or Firm*—Weingarten, Schurgin, Gagnebin & Hayes LLP

[57] ABSTRACT

An electrically conductive elastomer for grafting to a metal substrate is disclosed. The electrically conductive elastomer includes a mixture of an elastic material, a quantity of electrically conductive flakes, a thermoplastic elastomer material, a conductive thermoplastic polymer material, and a noble metal or noble metal composite material. The electrically conductive elastomer may further include a quantity of electrically conductive particles interspersed within the mixture. Alternatively, a quantity of electrically conductive particles may be imbedded in an outer surface of the electrically conductive elastomer. The electrically conductive elastomer is typically grafted to the substrate by a thermal process.

47 Claims, 3 Drawing Sheets

CONDUCTIVE ELASTOMER FOR GRAFTING TO A METAL SUBSTRATE

CROSS-REFERENCE TO RELATED APPLICATIONS

This patent application is a continuation-in-part patent application of U.S. patent application Ser. No. 08/736,830 filed Oct. 28, 1996.

STATEMENT REGARDING FEDERALLY SPONSORED RESEARCH OR DEVELOPMENT

Not Applicable

1. Field of Invention

The present invention relates generally to electrically conductive devices and, more particularly, to an electrically conductive elastomer for grafting to a metal substrate.

2. Background of the Invention

The electronic circuitry for most present day electronic products is typically provided on circuit boards. A circuit board provides electrical interconnections between electronic components mounted on the circuit board. The electronic components have electrically conductive leads or terminals which are typically soldered to electrically conductive through-holes or contact pads, respectively, formed on the circuit board. The electrically conductive leads or terminals of an electronic component are part of the packaging of a semiconductor die which actually contains all of the electronic circuitry associated with the electronic component. The packaging of a semiconductor die includes making electrically conductive wire bond connections between electrically conductive contact points on the semiconductor die and electrically conductive leads or terminals of a ceramic, plastic, or some other type of package.

The need for packaging a semiconductor die is two-fold. First, the package of an electronic component is a heat sink for the semiconductor die contained within the package. Second, the package of an electronic component provides electrically conductive leads and terminals by which the electronic component may be secured to a circuit board.

A major shortcoming of a semiconductor die package is the circuit board area that the package requires. That is, the size of a semiconductor die package is often two or three times the size of the semiconductor die that is contained therein. The extra area that is consumed by the package could be used for more circuitry on the circuit board.

Another shortcoming of a semiconductor die package is the potential for failure or breakage of the electrically conductive wire bond connections between the electrically conductive contact points on the semiconductor die and the electrically conductive leads or terminals of the package. Furthermore, the electrically conductive wire bond connections and the electrically conductive leads or terminals of the package are susceptible to noise and induce propagation delays in signals traveling thereover.

Accordingly, it would be beneficial to provide a means by which a semiconductor die may make electrical connections with electrically conductive contact pads on a circuit board without requiring extensive packaging of the semiconductor die. More particularly, it would be beneficial to provide a material which may be used to make direct electrical connections between electrically conductive contact points on a semiconductor die and electrically conductive contact pads on a circuit board.

SUMMARY OF THE INVENTION

The present invention contemplates an electrically conductive elastomer for grafting to a metal substrate. The electrically conductive elastomer comprises a mixture of an elastic material, a quantity of electrically conductive flakes, a thermoplastic elastomer material, a conductive thermoplastic polymer material, and a noble metal or noble metal composite material. The electrically conductive elastomer may further comprise a quantity of electrically conductive particles interspersed within the mixture. Alternatively, a quantity of electrically conductive particles may be imbedded in an outer surface of the electrically conductive elastomer. The electrically conductive elastomer is typically grafted to the substrate by a thermal process.

In one application, the electrically conductive elastomer is grafted to an electrically conductive contact pad on a circuit board to facilitate making an electrical connection between the electrically conductive contact pad and an electrically conductive contact point on a semiconductor die.

In view of the foregoing, it is readily apparent that the primary object of the present invention is to provide an electrically conductive elastomer for grafting to a metal substrate.

The above-stated primary object, as well as other objects, features, and advantages, of the present invention will become more readily apparent from the following detailed description which is to be read in conjunction with the appended drawings.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF THE INVENTION

Figure 1:
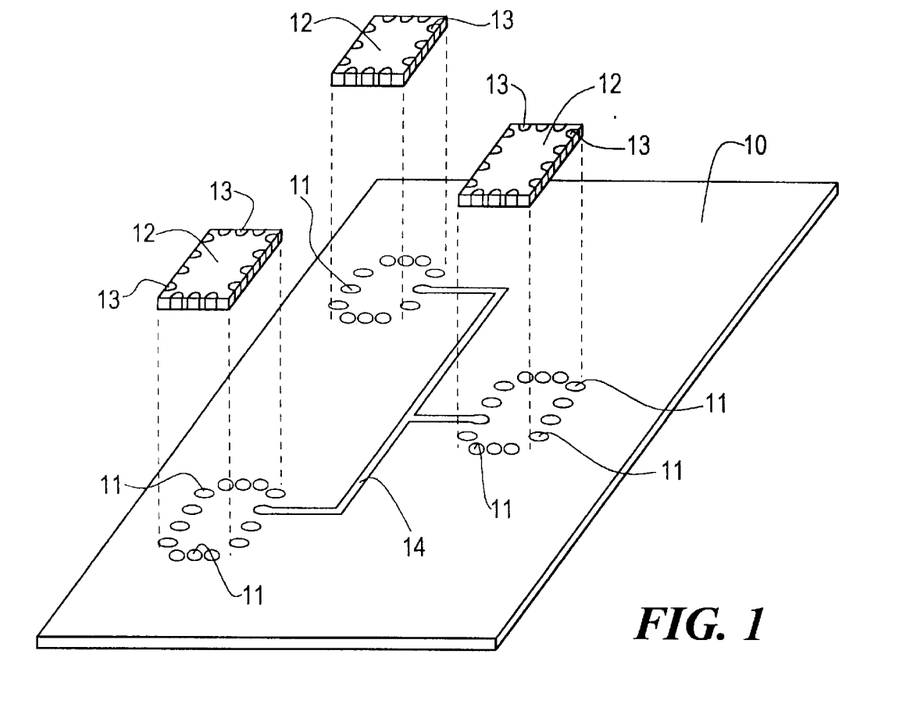
FIG. 1 is a perspective view of a section of a circuit board having a plurality of electrically conductive contact pads which have an electrically conductive elastomer material grafted thereto for making electrical connections with electrically conductive contact points on a semiconductor die in accordance with the present invention.

Referring to FIG. 1, there is shown a perspective view of a section of a circuit board 10 having a plurality of electrically conductive contact pads 12 for making electrical connections with electrically conductive contact points 14 on a semiconductor die 16. The electrically conductive contact pads 12 have electrically conductive traces 18 extending therefrom for making electrical connections with other devices (not shown) on the circuit board 10. An electrically conductive elastomer material is grafted directly onto the surface of the electrically conductive contact pads 12 to facilitate making the electrical connections between the electrically conductive contact pads 12 on the circuit board 10 and the electrically conductive contact points 14 on the semiconductor die 16.

The circuit board 10 may be fabricated of one of many different types of material that is typically used for such purposes such as, for example, FR4™. The electrically conductive contact pads 12 and the electrically conductive traces 18 are fabricated of a noble metal material or noble metal composite material such as, for example, a gold plated copper alloy. The electrically conductive contact pads 12 and the electrically conductive traces 18 may be formed on the circuit board 10 by any of the commonly known methods such as, for example, direct chemical deposition and photoresistive etching.

The electrically conductive contact points 14 are located on the underside of the semiconductor die 16 and may be formed of any type of electrically conductive material. Such electrically conductive contact points 14 are typically formed of gold.

The electrically conductive elastomer material is grafted directly to the noble metal material or noble metal composite material of the electrically conductive contact pads 12. As described in more detail below, the electrically conductive elastomer material facilitates making the electrical connections between the electrically conductive contact pads 12 on the circuit board 10 and the electrically conductive contact points 14 on the semiconductor die 16 by allowing the electrically conductive contact points 14 on the semiconductor die 16 to press against an electrically conductive deformable material so that each of the electrically conductive contact points 14 on the semiconductor die 16 will be in intimate contact with a corresponding one of the electrically conductive contact pads 12 on the circuit board 10. For example, referring to FIG. 2, there is shown an exploded cross-sectional view of the circuit board 10, the semiconductor die 16, and some associated mounting hardware 20. The circuit board 10 has the electrically conductive contact pads 12 formed thereon (the electrically conductive traces 18 are not shown for purposes of figure clarity), and each of the electrically conductive contact pads 12 has an electrically conductive elastomer material 22 grafted directly thereto. The semiconductor die 16 has the electrically conductive contact points 14 formed on the underside thereof. The mounting hardware 20 comprises a heat sink 24, a back-up plate 26, a pair of mounting bolts 28, and a corresponding pair of mounting nuts 30. It should be noted that the mounting hardware 20 is shown for illustrative purposes only and that numerous other mounting schemes may instead be utilized.

Figure 2:
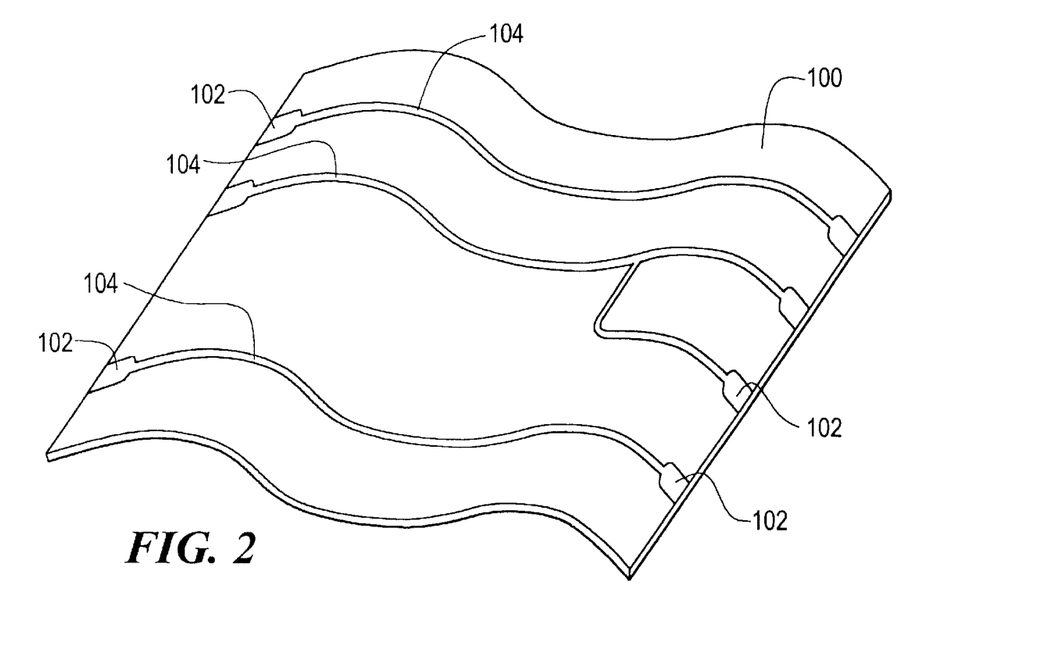
FIG. 2 is an exploded cross-sectional view of a circuit board having a plurality of electrically conductive contact pads which have an electrically conductive elastomer material grafted thereto for making electrical connections with electrically conductive contact points on a semiconductor die in accordance with the present invention.

When the mounting nuts 30 are tightened on the mounting bolts 28, the heat sink 24 forces the semiconductor die 16 towards the circuit board 10. Thus, the electrically conductive contact points 14 on the semiconductor die 16 are forced against the electrically conductive elastomer material 22 grafted to the electrically conductive contact pads 12 on the circuit board 10. The electrically conductive elastomer material 22 that is grafted to each electrically conductive contact pad 12 is resilient so that the electrically conductive elastomer material 22 readily adapts to the shape of and the pressure applied by a corresponding electrically conductive contact point 14 on the semiconductor die 16, thereby insuring intimate contact between each of the electrically conductive contact points 14 on the semiconductor die 16 and the electrically conductive elastomer material 22 that is grafted to a corresponding electrically conductive contact pad 12 on the circuit board 10. The electrically conductive elastomer material 22 is resilient in that it will deform under pressure applied by an electrically conductive contact point 14 on the semiconductor die 16, and will return to its original shape when pressure is removed.

The electrically conductive elastomer material 22 comprises a mixture of an elastic material, a quantity of electrically conductive flakes, a thermoplastic elastomer material, a conductive thermoplastic polymer material, and a noble metal or noble metal composite material. The elastic material may be any one of a variety of elastic materials such as, for example, silicone rubber or flourosilicone rubber. The conductive flakes may be fabricated of many different types of conductive or semiconductive materials such as, for example, silver, nickel, or carbon. Alternatively, the conductive flakes may be fabricated of many different types of conductive, semiconductive, or insulative materials which are coated with or have interspersed therein other conductive or semiconductive materials such as, for example, silver, nickel, or carbon. The size of the conductive flakes may vary depending on the level of conductivity that is required and the size of the electrically conductive contact pads 12.

The thermoplastic elastomer material may be any one of a variety of thermoplastic elastomers such as, for example, VITON™. The thermoplastic elastomer material provides a bridging function between the elastic material and the conductive thermoplastic polymer material. That is, as described in more detail below, polymer chains in the thermoplastic elastomer material are grafted to polymer chains in the elastic material and the conductive thermoplastic polymer material when electrically conductive elastomer material 22 is grafted to the electrically conductive contact pads 12.

The conductive thermoplastic polymer material is a conductive thermoplastic polymer chain comprising a thermoplastic material chain core with a conductive material at the ends of at least some, if not all, of the branches which extend off of the thermoplastic material chain core. Thus, the thermoplastic material chain core is not conductive, but the outer regions of the chain defined by the ends of the branches are. The thermoplastic material chain core provides cohesive bonds for the conductive material at the ends of the branches which extend off of the thermoplastic material chain core.

The conductive thermoplastic polymer material provides a bridging function between the thermoplastic elastomer material and the noble metal or noble metal composite material. That is, as described in more detail below, polymer chains in the conductive thermoplastic polymer material are grafted to polymer chains in the thermoplastic elastomer material and the noble metal or noble metal composite material when electrically conductive elastomer material 22 is grafted to the electrically conductive contact pads 12.

The thermoplastic material which forms the chain core may be formed from any one of a variety of thermoplastic materials such as, for example, ULTEM™. The conductive material at the ends of the branches which extend off of the thermoplastic material chain core is a noble metal such as, for example, silver. It should be noted that the conductive material is in an ionic state.

If the electrically conductive contact pads 12 are fabricated of a gold plated copper alloy, the noble metal or noble metal composite material in the electrically conductive elastomer material does not also have to be a gold plated copper alloy. That is, the noble metal or noble metal composite material in the electrically conductive elastomer material 22 may be any one of a variety of noble metal or noble metal composite materials such as, for example, silver coated carbon fibers. It is sufficient that the electrically conductive contact pads 12 and the noble metal or noble metal composite material in the electrically conductive elastomer material 22 are both noble metal or noble metal composite materials to insure that a strong chemical bond will form between the electrically conductive elastomer material 22 and the electrically conductive contact pads 12 when the electrically conductive elastomer material 22 is grafted to the electrically conductive contact pads 12. That is, as described in more detail below, polymer chains in the noble metal or noble metal composite material of the electrically conductive elastomer material 22 are grafted to polymer chains in the noble metal or noble metal composite material of the electrically conductive contact pads 12 when the electrically conductive elastomer material 22 is grafted to the electrically conductive contact pads 12.

The electrically conductive elastomer material 22 is grafted to the electrically conductive contact pads 12 by a thermal grafting process which typically begins by providing the noble metal or noble metal composite material of the electrically conductive contact pads 12 in a fully cured state. The electrically conductive elastomer material 22 is deposited on the electrically conductive contact pads 12 in an uncured state by spray coating, roller coating, transfer pad printing, or any of a variety of other known methods. The electrically conductive contact pads 12 and the electrically conductive elastomer material 22 are then subjected to a thermal cycle whereby the electrically conductive elastomer material 22 is fully cured and grafted to the electrically conductive contact pads 12. During this thermal grafting process, polymer chains in the electrically conductive elastomer material 22 are grafted to polymer chains in the noble metal or noble metal composite material of the electrically conductive contact pads 12 so as to form a strong chemical bond between the electrically conductive elastomer material 22 and the electrically conductive contact pads 12. In the uncured state, the elastic material, the conductive flakes, the thermoplastic elastomer material, the conductive thermoplastic polymer material, and the noble metal or noble metal composite material are typically suspended in a solvent, for example, TOLUENE™, which evaporates during the thermal cycle. It should be noted that the grafting process may alternatively involve irradiation or compressive bonding to fully cure and graft the electrically conductive elastomer material 22 to the electrically conductive contact pads 12.

The conductive flakes in the electrically conductive elastomer material 22 provide low resistivity even when the electrically conductive elastomer material 22 is being deformed through expansion or compression since the surface area of the conductive flakes is large enough for electrical contact to be made between adjacent conductive flakes when such deformities occur. For instance, during lengthwise expansion of the electrically conductive elastomer material 22, the length of the electrically conductive elastomer material 22 is increased while the thickness of the electrically conductive elastomer material 22 is decreased. The decrease in thickness brings adjacent conductive flakes closer together, thereby increasing the likelihood that the large surface areas of adjacent conductive flakes will come into physical, and hence electrical, contact with each other. The increase in length results in lateral movement of the conductive flakes, thereby causing the large surface areas of adjacent conductive flakes to rub or scrape against each other so that physical, and hence electrical, contact between adjacent conductive flakes is maintained.

The durometer rating of the electrically conductive elastomer material 22 typically ranges between 40 and 80 on the Shore A scale. Such a durometer rating allows the electrically conductive elastomer material 22 to be expanded or compressed to at least 33% of its at-rest shape. When such a deformation occurs, the conductive flakes interspersed in the electrically conductive elastomer material 22 interact as described above so as to maintain a low resistivity throughout the electrically conductive elastomer material 22. An electrically conductive elastomer material that has been grafted to electrically conductive contact pads on a circuit board in accordance with the present invention has been shown to maintain a resistance in the range of 20–30 mohms during measurements performed while deforming the electrically conductive elastomer material 22 within the above-described limits.

At this point it should be noted that although the electrically conductive elastomer material 22 has been shown above to be useful in facilitating the making of electrical connections between electrically conductive contact pads on a circuit board and electrically conductive contact points on a semiconductor die, the electrically conductive elastomer material 22 can also be used to facilitate the making of electrical connections between electrically conductive contact pads on a circuit board and electrically conductive terminals on leaded or leadless integrated circuits. Furthermore, the electrically conductive elastomer material 22 can be grafted to flexible metal materials which are used in flex film circuits and the like.

At this point it should be noted that it is possible to add further materials to the electrically conductive elastomer material mixture in order to further facilitate in the making of electrical connections between the electrically conductive elastomer material 22 and any mating electrically conductive surface.

Figure 3:
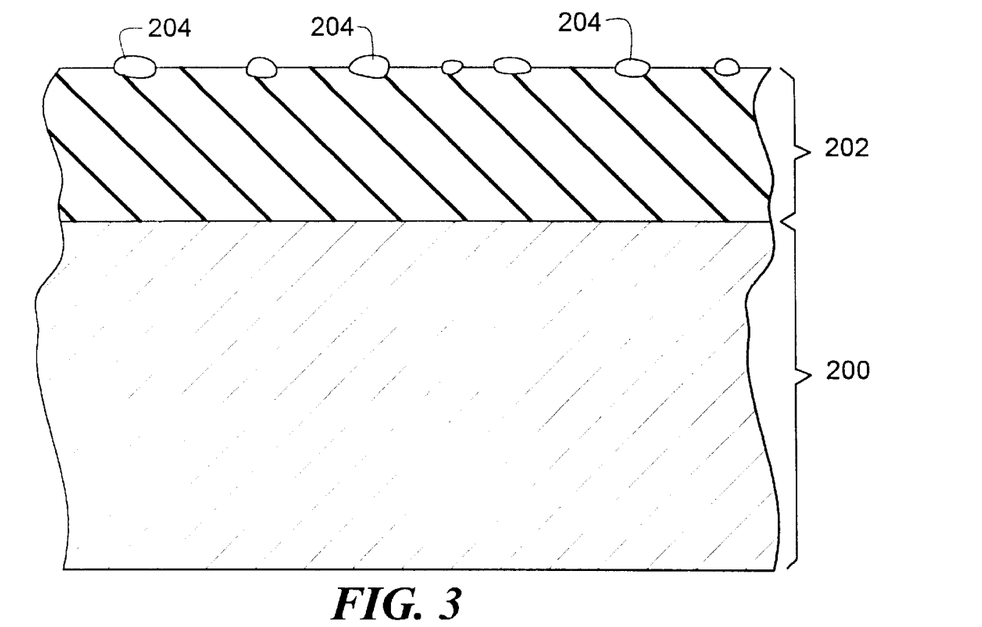
FIG. 3 is a cross-sectional view of a noble metal or noble metal composite material substrate having an electrically conductive elastomer material with imbedded conductive indenting particles grafted thereto in accordance with the present invention.

Referring to FIG. 3, there is shown a cross-sectional view of a noble metal or noble metal composite material substrate 100 having an electrically conductive elastomer material 102 grafted thereto. In accordance with the present invention as described above, the electrically conductive elastomer material 102 comprises a mixture of an elastic material, a quantity of electrically conductive flakes, a thermoplastic elastomer material, a conductive thermoplastic polymer material, and a noble metal or noble metal composite material. Also in accordance with the present invention as described above, since both the noble metal or noble metal composite material substrate 100 and the noble metal or noble metal composite material in the electrically conductive elastomer material 102 are in fact both noble metal or noble metal composite materials, a strong chemical bond will form between the electrically conductive elastomer material 102 and the noble metal or noble metal composite material substrate 100 when the electrically conductive elastomer material 102 is grafted to the noble metal or noble metal composite material substrate 100.

In order to further facilitate in the making of electrical connections between the electrically conductive elastomer material 102 and any mating electrically conductive surface, the electrically conductive elastomer material 102 may further comprise a quantity of electrically conductive indenting particles 104 that are imbedded into the surface of the electrically conductive elastomer material 102. The conductive indenting particles 104 are preferably applied to the surface of the electrically conductive elastomer material 102 prior to a thermal cycle so that the particles 104 are secured to the electrically conductive elastomer material 102 when it fully cures. The indenting nature of the conductive indenting particles 104 provides a means by which an insulating oxide which may have formed on an electrically conductive surface which is to come into contact with the electrically conductive elastomer material 102 may be pushed aside so that an improved electrical connection may be formed between that electrically conductive surface and the electrically conductive elastomer material 102. It should be noted that the conductive indenting particles 104 may push aside other contaminants such as fibers and particulates which may be present on a mating conductive surface.

The conductive indenting particles 104 may be fabricated of many different types of conductive or semiconductive materials such as, for example, silver, nickel, or carbon. Alternatively, the conductive indenting particles 104 may be fabricated of many different types of conductive, semiconductive, or insulative materials which are coated with or have interspersed therein other conductive or semiconductive materials such as, for example, silver, nickel, or carbon. The conductive indenting particles 104 typically have a 50 μm average particle size.

Figure 4:
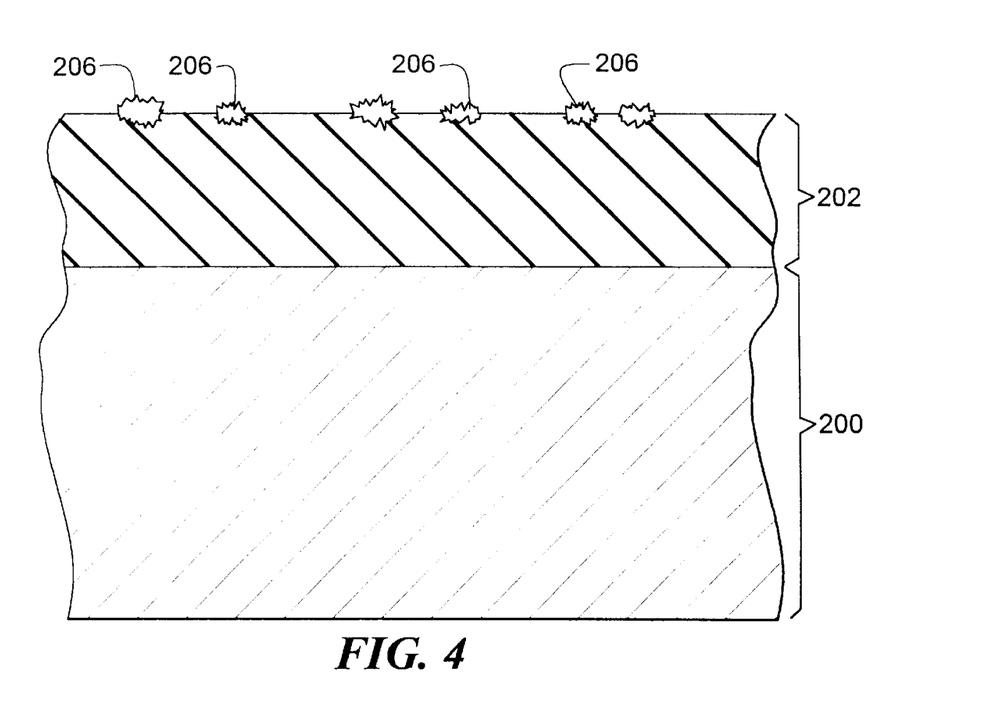
FIG. 4 is a cross-sectional view of a noble metal or noble metal composite material substrate having an electrically conductive elastomer material with imbedded conductive piercing particles grafted thereto in accordance with the present invention.

Referring to FIG. 4, there is shown a cross-sectional view of the noble metal or noble metal composite material substrate 100 having the electrically conductive elastomer material 102 grafted thereto. In order to further facilitate in the making of electrical connections between the electrically conductive elastomer material 102 and any mating electrically conductive surface, the electrically conductive elastomer material 102 may further comprise a quantity of electrically conductive piercing particles 106 that are imbedded into the surface of the electrically conductive elastomer material 102. The conductive piercing particles 106 are preferably applied to the surface of the electrically conductive elastomer material 102 prior to a thermal cycle so that the particles 106 are secured to the electrically conductive elastomer material 102 when it fully cures. The piercing nature of the conductive piercing particles 106 provides a means by which an insulating oxide which may have formed on an electrically conductive surface which is to come into contact with the electrically conductive elastomer material 102 may be pierced so that an improved electrical connection may be formed between that electrically conductive surface and the electrically conductive elastomer material 102. It should be noted that the conductive piercing particles 106 may pierce other contaminants such as fibers and particulates which may be present on a mating conductive surface.

The conductive piercing particles 106 may be fabricated of many different types of conductive or semiconductive materials such as, for example, silver, nickel, or carbon. Alternatively, the conductive piercing particles 106 may be fabricated of many different types of conductive, semiconductive, or insulative materials which are coated with or have interspersed therein other conductive or semiconductive materials such as, for example, silver, nickel, or carbon. The conductive piercing particles 106 typically have a 40 μm average particle size.

Figure 5:
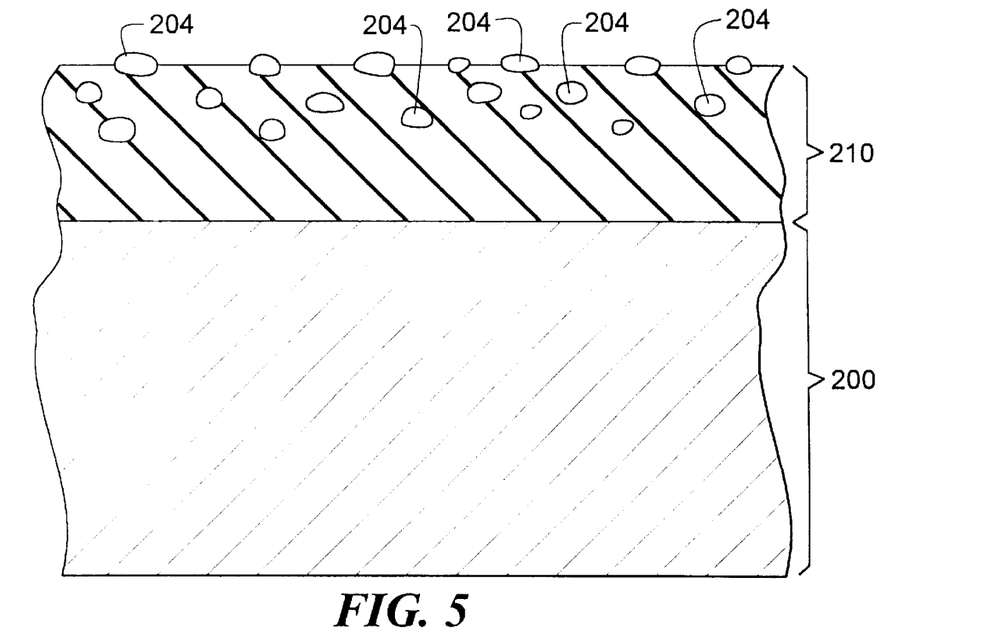
FIG. 5 is a cross-sectional view of a noble metal or noble metal composite material substrate having an electrically conductive elastomer material with conductive indenting particles grafted thereto in accordance with the present invention.

Referring to FIG. 5, there is shown a cross-sectional view of the noble metal or noble metal composite material substrate 100 having an electrically conductive elastomer material 110 grafted thereto. In this particular embodiment, the electrically conductive elastomer material 110 comprises a mixture of an elastic material, a quantity of electrically conductive flakes, a thermoplastic elastomer material, a conductive thermoplastic polymer material, a noble metal or noble metal composite material, and a quantity of the electrically conductive indenting particles 104 (only the indenting particles are shown for purposes of figure clarity). That is, the conductive indenting particles 104 are deposited on the substrate 100 along with the rest of the materials in the electrically conductive elastomer material 110.

The distribution of the conductive indenting particles 104 in the electrically conductive elastomer material 110 is shown to be near the surface of the electrically conductive elastomer material 110 since the conductive indenting particles 104 are likely to bounce off the substrate 100 during the application of the electrically conductive elastomer material 110. That is, when the electrically conductive elastomer material 110 is applied to the substrate 100 by spray coating, the conductive indenting particles 104 are likely to bounce off the substrate 100. Of course, this location for the conductive indenting particles 104 is preferable based on their functionality (e.g., to push aside oxide on a mating conductive surface). The amount of the conductive indenting particles 104 in the electrically conductive elastomer material 110 need typically only be 5% nominal by weight in order to insure their proper functionality.

Figure 6:
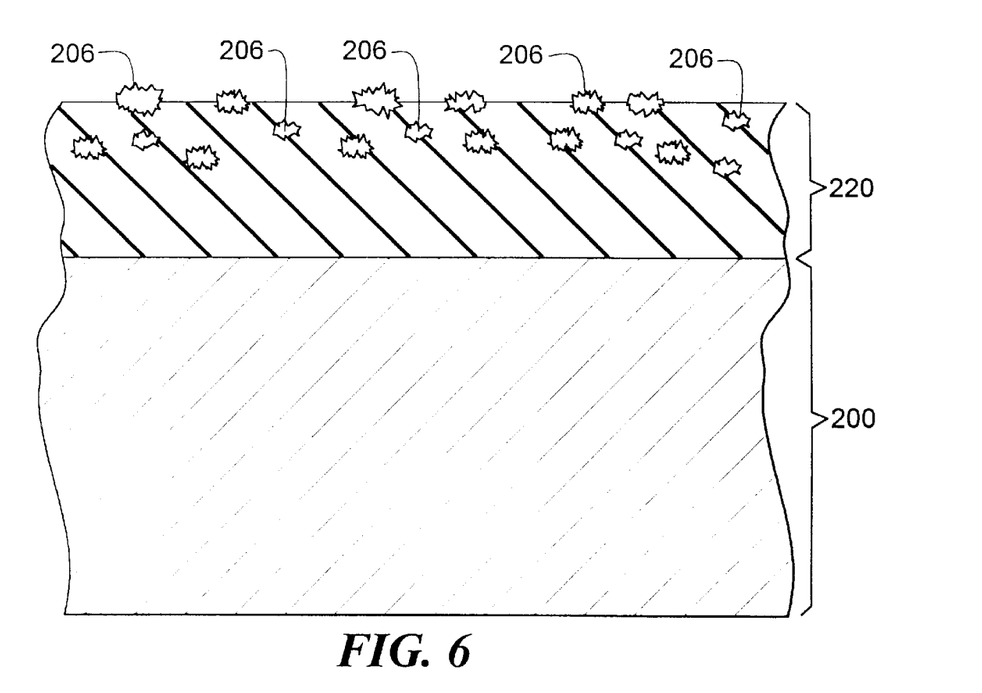
FIG. 6 is a cross-sectional view of a noble metal or noble metal composite material substrate having an electrically conductive elastomer material with conductive piercing particles grafted thereto in accordance with the present invention.

Referring to FIG. 6, there is shown a cross-sectional view of the noble metal or noble metal composite material substrate 100 having an electrically conductive elastomer material 120 grafted thereto. In this particular embodiment, the electrically conductive elastomer material 120 comprises a mixture of an elastic material, a quantity of electrically conductive flakes, a thermoplastic elastomer material, a conductive thermoplastic polymer material, a noble metal or noble metal composite material, and a quantity of the electrically conductive indenting particles 106 (only the piercing particles are shown for purposes of figure clarity). That is, the conductive piercing particles 106 are deposited on the substrate 100 along with the rest of the materials in the electrically conductive elastomer material 120.

The distribution of the conductive piercing particles 106 in the electrically conductive elastomer material 120 is shown to be near the surface of the electrically conductive elastomer material 120 since the conductive piercing particles 106 are likely to bounce off the substrate 100 during the application of the electrically conductive elastomer material 120. That is, when the electrically conductive elastomer material 120 is applied to the substrate 100 by spray coating, the conductive piercing particles 106 are likely to bounce off the substrate 100. Of course, this location for the conductive piercing particles 106 is preferable based on their functionality (e.g., to pierce oxide on a mating conductive surface). The amount of the conductive piercing particles 106 in the electrically conductive elastomer material 120 need typically only be 5% nominal by weight in order to insure their proper functionality.

At this point it should be noted that any of the above-described electrically conductive elastomer materials, including those with electrically conductive piercing and indenting particles, may be utilized for any number of applications wherein an electrically conductive surface, trace, coating, or other electrically conductive element having elastic properties is required.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. An electrical interconnect comprising:
   a substrate, said substrate having an outer surface, said substrate being formed of a conductive metal material; and
   a conductive elastomer grafted to at least a portion of said outer surface of said substrate, said conductive elastomer being formed with a mixture of a non-conductive elastic material, a quantity of conductive flakes, a thermoplastic elastomer material, a conductive thermoplastic polymer material, and a conductive metal material.

2. The electrical interconnect as defined in claim 1, wherein said substrate is formed of a noble metal material.

3. The electrical interconnect as defined in claim 1, wherein said substrate is formed of a noble metal composite material.

4. The electrical interconnect as defined in claim 1, wherein said conductive metal material in said conductive elastomer is formed of a noble metal material.

5. The electrical interconnect as defined in claim 1, wherein said conductive metal material in said conductive elastomer is formed of a noble metal composite material.

6. The electrical interconnect as defined in claim 1, wherein said conductive thermoplastic polymer material is a conductive thermoplastic polymer chain comprising a thermoplastic material chain core with a conductive material at the ends of at least some branches which extend off of said thermoplastic material chain core.

7. The electrical interconnect as defined in claim 1, wherein the grafting of said conductive elastomer to said substrate is performed by a thermal process.

8. The electrical interconnect as defined in claim 1, wherein the grafting of said conductive elastomer to said substrate is performed by irradiation.

9. The electrical interconnect as defined in claim 1, wherein the grafting of said conductive elastomer to said substrate is performed by compression.

10. The electrical interconnect as defined in claim 1, wherein said conductive flakes are formed with a solid conductive material.

11. The electrical interconnect as defined in claim 1, wherein said conductive flakes are formed with a semiconductive material that is coated with a conductive material.

12. The electrical interconnect as defined in claim 1, wherein said conductive flakes are formed with a non-conductive material that is coated with a conductive material.

13. The electrical interconnect as defined in claim 1, wherein said conductive elastomer has an outer surface, and wherein said conductive elastomer is further formed with a quantity of conductive particles in said mixture such that at least some of said conductive particles are present along said outer surface of said conductive elastomer.

14. The electrical interconnect as defined in claim 13, wherein said conductive particles have a rounded outer surface so as to push aside an oxide or other contaminants which may have formed on a mating conductive surface.

15. The electrical interconnect as defined in claim 14, wherein said conductive particles typically have a 50 $\mu$m average particle size.

16. The electrical interconnect as defined in claim 13, wherein said conductive particles have a jagged outer surface so as to pierce through an oxide or other contaminants which may have formed on a mating conductive surface.

17. The electrical interconnect as defined in claim 16, wherein said conductive particles typically have a 40 $\mu$m average particle size.

18. The electrical interconnect as defined in claim 13, wherein said conductive particles are formed with a solid conductive material.

19. The electrical interconnect as defined in claim 13, wherein said conductive particles are formed with a semiconductive material that is coated with a conductive material.

20. The electrical interconnect as defined in claim 13, wherein said conductive particles are formed with a non-conductive material that is coated with a conductive material.

21. The electrical interconnect as defined in claim 1, wherein said conductive elastomer has an outer surface, and wherein said conductive elastomer is further formed with a quantity of conductive particles imbedded in said outer surface of said conductive elastomer.

22. The electrical interconnect as defined in claim 21, wherein said conductive particles have a rounded outer surface so as to push aside an oxide or other contaminants which may have formed on a mating conductive surface.

23. The electrical interconnect as defined in claim 22, wherein said conductive particles typically have a 50 $\mu$m average particle size.

24. The electrical interconnect as defined in claim 21, wherein said conductive particles have a jagged outer surface so as to pierce through an oxide or other contaminants which may have formed on a mating conductive surface.

25. The electrical interconnect as defined in claim 24, wherein said conductive particles typically have a 40 $\mu$m average particle size.

26. The electrical interconnect as defined in claim 21, wherein said conductive particles are formed with a solid conductive material.

27. The electrical interconnect as defined in claim 21, wherein said conductive particles are formed with a semiconductive material that is coated with a conductive material.

28. The electrical interconnect as defined in claim 21, wherein said conductive particles are formed with a non-conductive material that is coated with a conductive material.

29. A conductive elastomer comprising a mixture of a non-conductive elastic material, a quantity of conductive flakes, a thermoplastic elastomer material, a conductive thermoplastic polymer material, and a conductive metal material.

30. The conductive elastomer as defined in claim 29, wherein said conductive metal material is formed of a noble metal material.

31. The conductive elastomer as defined in claim 29, wherein said conductive metal material is formed of a noble metal composite material.

32. The conductive elastomer as defined in claim 29, wherein said conductive thermoplastic polymer material is a conductive thermoplastic polymer chain comprising a thermoplastic material chain core with a conductive material at the ends of at least some branches which extend off of said thermoplastic material chain core.

33. The conductive elastomer as defined in claim 29, wherein said non-conductive elastic material, said quantity of conductive flakes, said thermoplastic elastomer material, said conductive thermoplastic polymer material, and said conductive material are initially suspended in a solvent.

34. The conductive elastomer as defined in claim 29, wherein said conductive flakes are formed with a solid conductive material.

35. The conductive elastomer as defined in claim 29, wherein said conductive flakes are formed with a semi-conductive material that is coated with a conductive material.

36. The conductive elastomer as defined in claim 29, wherein said conductive flakes are formed with a non-conductive material that is coated with a conductive material.

37. The conductive elastomer as defined in claim 29, further comprising a quantity of conductive particles interspersed in said mixture.

38. The conductive elastomer as defined in claim 37, wherein said conductive particles have a rounded outer surface so as to push aside an oxide or other contaminants which may have formed on a mating conductive surface.

39. The conductive elastomer as defined in claim 38, wherein said conductive particles typically have a 50 μm average particle size.

40. The conductive elastomer as defined in claim 37, wherein said conductive particles have a jagged outer surface so as to pierce through an oxide or other contaminants which may have formed on a mating conductive surface.

41. The conductive elastomer as defined in claim 40, wherein said conductive particles typically have a 40 μm average particle size.

42. The conductive elastomer as defined in claim 37, wherein said conductive particles are formed with a solid conductive material.

43. The conductive elastomer as defined in claim 37, wherein said conductive particles are formed with a semi-conductive material that is coated with a conductive material.

44. The conductive elastomer as defined in claim 37, wherein said conductive particles are formed with a non-conductive material that is coated with a conductive material.

45. A method for grafting a conductive elastomer to a metal substrate, said method comprising the steps of:

provilding a substrate, said substrate having an outer surface, said substrate being formed of a conductive noble metal material;

applying a conductive elastomer to said outer surface of said substrate, said conductive elastomer being formed with a mixture of a non-conductive elastic material, a quantity of conductive flakes, a thermoplastic elastomer material, a conductive thermoplastic polymer material, and a conductive metal material; and subjecting said substrate and said conductive elastomer to a thermal process so that polymer chains in said conductive elastomer are grafted to polymer chains in said substrate.

46. The method as defined in claim 45, wherein said conductive elastomer is further formed with a quantity of conductive particles interspersed in said mixture such that at least some of said conductive particles are present along an outer surface of said conductive elastomer after subjecting said substrate and said conductive elastomer to said thermal process.

47. The method as defined in claim 45, further comprising the step of applying a quantity of conductive particles to an outer surface of said conductive elastomer prior to subjecting said substrate and said conductive elastomer to said thermal process so that said quantity of conductive particles become imbedded in said outer surface of said conductive elastomer.

* * * * *

UNITED STATES PATENT AND TRADEMARK OFFICE
CERTIFICATE OF CORRECTION

PATENT NO. : 5,977,489
DATED : November 2, 1999
INVENTOR(S) : David R. Crotzer, Mark G. Hanrahan and Neill N. Silva It is certified that error appears in the above-identified patent and that said Letters Patent is hereby corrected as shown below:

Drawings,
Delete Figs. 1-6 and substitute the following Figs. 1-6:

FIG. 1

UNITED STATES PATENT AND TRADEMARK OFFICE
CERTIFICATE OF CORRECTION

PATENT NO. : 5,977,489
DATED : November 2, 1999
INVENTOR(S) : David R. Crotzer, Mark G. Hanrahan and Neill N. Silva It is certified that error appears in the above-identified patent and that said Letters Patent is hereby corrected as shown below:

Drawings (cont'd),

FIG. 2

UNITED STATES PATENT AND TRADEMARK OFFICE
CERTIFICATE OF CORRECTION

PATENT NO.    : 5,977,489
DATED         : November 2, 1999
INVENTOR(S)   : David R. Crotzer, Mark G. Hanrahan and Neill N. Silva It is certified that error appears in the above-identified patent and that said Letters Patent is hereby corrected as shown below:

Drawings (cont'd),

*FIG. 3*

UNITED STATES PATENT AND TRADEMARK OFFICE
CERTIFICATE OF CORRECTION

PATENT NO.    : 5,977,489                                                      Page 4 of 6
DATED         : November 2, 1999
INVENTOR(S)   : David R. Crotzer, Mark G. Hanrahan and Neill N. Silva It is certified that error appears in the above-identified patent and that said Letters Patent is hereby corrected as shown below:

Drawings (cont'd),

*FIG. 4*

UNITED STATES PATENT AND TRADEMARK OFFICE
CERTIFICATE OF CORRECTION

PATENT NO.   : 5,977,489  
DATED        : November 2, 1999  
INVENTOR(S)  : David R. Crotzer, Mark G. Hanrahan and Neill N. Silva Page 5 of 6

It is certified that error appears in the above-identified patent and that said Letters Patent is hereby corrected as shown below:

Drawings (cont'd),

*FIG. 5*

UNITED STATES PATENT AND TRADEMARK OFFICE
CERTIFICATE OF CORRECTION

PATENT NO. : 5,977,489
DATED : November 2, 1999
INVENTOR(S) : David R. Crotzer, Mark G. Hanrahan and Neill N. Silva It is certified that error appears in the above-identified patent and that said Letters Patent is hereby corrected as shown below:

Drawings (cont'd),

FIG. 6

Signed and Sealed this

Fourteenth Day of February, 2006

JON W. DUDAS
*Director of the United States Patent and Trademark Office*